United States Patent
Byun

(10) Patent No.: US 11,163,491 B2
(45) Date of Patent: Nov. 2, 2021

(54) MEMORY SYSTEM AND METHOD OF OPERATING THE SAME

(71) Applicant: SK hynix Inc., Gyeonggi-do (KR)

(72) Inventor: Eu Joon Byun, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/577,369

(22) Filed: Sep. 20, 2019

(65) Prior Publication Data

US 2020/0310688 A1 Oct. 1, 2020

(30) Foreign Application Priority Data

Apr. 1, 2019 (KR) .......................... 10-2019-0038043

(51) Int. Cl.
*G06F 3/06* (2006.01)

(52) U.S. Cl.
CPC .......... *G06F 3/0659* (2013.01); *G06F 3/0604* (2013.01); *G06F 3/064* (2013.01); *G06F 3/0679* (2013.01)

(58) Field of Classification Search
None
See application file for complete search history.

(56) References Cited

U.S. PATENT DOCUMENTS

| 2017/0090785 A1* | 3/2017 | Kashyap | G06F 3/0679 |
| 2018/0150261 A1* | 5/2018 | Nam | G06F 3/0679 |
| 2019/0012080 A1* | 1/2019 | Chen | G06F 3/0652 |
| 2019/0065366 A1* | 2/2019 | Muchherla | G06F 3/0634 |
| 2019/0095116 A1* | 3/2019 | Igahara | G06F 12/10 |

FOREIGN PATENT DOCUMENTS

KR   10-2017-0030702   3/2017

* cited by examiner

*Primary Examiner* — Ryan Bertram
*Assistant Examiner* — Edmund H Kwong
(74) *Attorney, Agent, or Firm* — IP & T Group LLP

(57) ABSTRACT

Provided herein is a memory system and a method of operating the memory system. The memory system may include: a memory device including a plurality of memory blocks; and a controller configured to control the memory device to perform a read operation in response to a host command, and configured to control a read reclaim operation based on a read count of each of the plurality of memory blocks. During the read reclaim operation, the controller may select a program mode of a target memory block depending on the amount of valid data read from a victim memory block, and control the memory device to store the valid data in the target memory block based on the selected program mode.

13 Claims, 10 Drawing Sheets

MEMORY SYSTEM AND METHOD OF OPERATING THE SAME

CROSS-REFERENCE TO RELATED APPLICATION

The present application claims priority under 35 U.S.C. § 119(a) to Korean patent application number 10-2019-0038043, filed on Apr. 1, 2019, the entire disclosure of which is incorporated herein by reference in its entirety.

BACKGROUND

Field of Invention

Various embodiments of the present disclosure generally relate to an electronic device, and more particularly, to a memory system and a method of operating the memory system.

Description of Related Art

The paradigm for the computer environment has become ubiquitous, and computer systems can be used anytime and anywhere. The use of portable electronic devices such as mobile phones, digital cameras, and notebook computers has rapidly increased. In general, such portable electronic devices use a memory system which employs a memory device (i.e. storage device). The data storage device is used as a main memory device or an auxiliary memory device of the portable electronic devices.

A data storage device using a memory device provides advantages in that, since there is no mechanical driving part, stability and durability are excellent, an information access speed is increased, and power consumption is reduced. Data storage devices, as an example of the memory system having such advantages, may include a universal serial bus (USB) memory device, a memory card having various interfaces, a solid state drive (SSD), and so forth.

Memory devices are classified into volatile memory devices and nonvolatile memory devices.

A nonvolatile memory device, although having comparatively low read and write speeds, may retain data stored therein even when power supply is interrupted. Therefore, the nonvolatile memory device is used when there is the need for storing data which is required to be retained regardless of whether or not it is connected to a power supply. Representative examples of the nonvolatile memory device include a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. The flash memory is classified into a NOR type memory and a NAND type memory.

SUMMARY

Various embodiments of the present disclosure are directed to a memory system capable of reliably storing data read from a victim memory block during a read reclaim operation, and a method of operating the memory system.

An embodiment of the present disclosure may provide for a memory system including: a memory device including a plurality of memory blocks; and a controller configured to control the memory device to perform a read operation in response to a host command, and configured to control a read reclaim operation based on a read count of each of the plurality of memory blocks. During the read reclaim operation, the controller may select a program mode of a target memory block depending on the amount of valid data read from a victim memory block, and control the memory device to store the valid data in the target memory block based on the selected program mode.

An embodiment of the present disclosure may provide for a memory system including: a memory device including a plurality of memory blocks; and a controller configured to control a read reclaim operation of reading valid data stored in a victim memory block having a read count greater than a preset reference count among the plurality of memory blocks, and programming the valid data to a target memory block of the plurality of memory blocks. The controller may select a program mode of the target memory block based on an amount of the valid data.

An embodiment of the present disclosure may provide for a method of operating a memory system, including: performing a read operation on a memory device including a plurality of memory blocks; selecting a victim memory block having a read count greater than a preset reference count among the plurality of memory blocks; reading valid data stored in the victim memory block; comparing an amount of the read valid data with a preset reference amount, and selecting a program mode for the valid data according to a result of the comparing; and programming the read valid data to a target memory block in the selected program mode. An embodiment of the present disclosure may provide for a memory system including: a memory device configured to program data into a first block according to a first program scheme; and a controller configured to control, when an amount of valid data stored in the first block is less than a threshold, the memory device to program the valid data into a second block according to a second program scheme allowing more reliable programming of data than the first program scheme.

An embodiment of the present disclosure may provide for a method of operating a memory system, including: programming data into a first block according to a first program scheme; and programming, when an amount of valid data stored in the first block is less than a threshold, the valid data into a second block according to a second program scheme allowing more reliable programming of data than the first program scheme.

An embodiment of the present disclosure may provide for a method of a controller for controlling a memory device, the operating method: controlling the memory device to program data into a first block according to a first program scheme; and controlling, when an amount of valid data stored in the first block is less than a threshold, the memory device to program the valid data into a second block according to a second program scheme allowing more reliable programming of data than the first program scheme.

DETAILED DESCRIPTION

Figure 1:
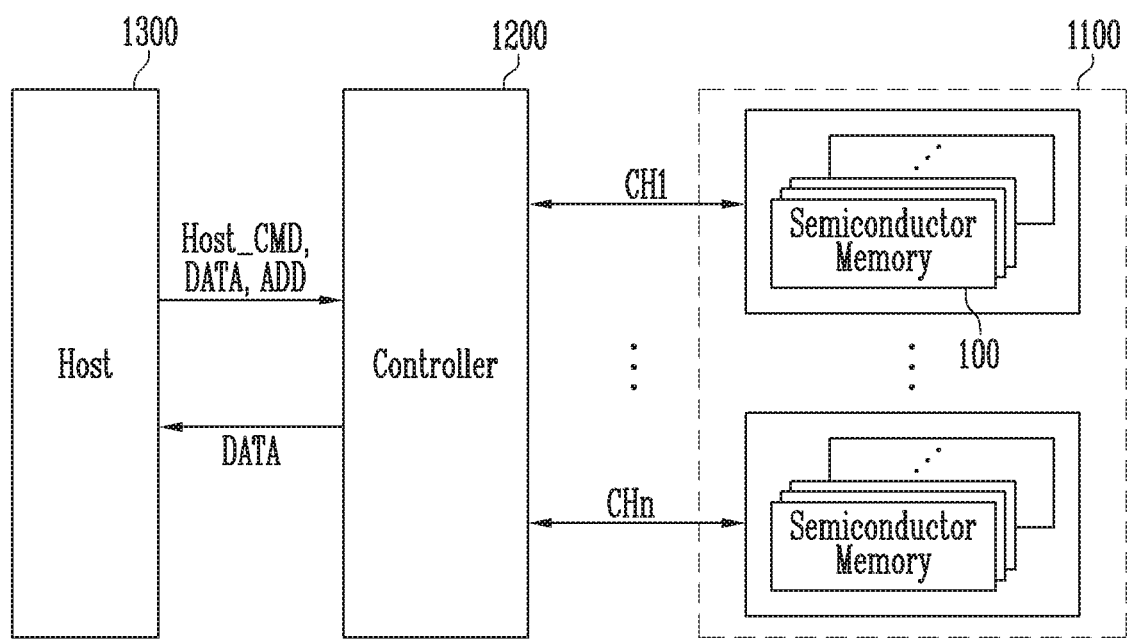
FIG. 1 is a block diagram illustrating a memory system in accordance with an embodiment of the present disclosure.

Specific structural or functional descriptions in the embodiments of the present disclosure introduced in this specification or application are only for description of the embodiments of the present disclosure. The descriptions should not be construed as being limited to the embodiments described in the specification or application.

The present disclosure will now be described in detail based on embodiments. The present disclosure may, however, be embodied in many different forms and should not be construed as being limited to only the embodiments set forth herein, but should be construed as covering modifications, equivalents or alternatives falling within ideas and technical scopes of the present disclosure. However, it is to be understood that the present description is not intended to limit the present disclosure to those exemplary embodiments, and the present disclosure is intended to cover not only the exemplary embodiments, but also various alternatives, modifications, equivalents and other embodiments that fall within the spirit and scope of the present disclosure.

It will be understood that, although the terms "first", "second", etc. may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that describe the relationship between elements, such as "between", "directly between", "adjacent to", or directly adjacent to" should be construed in the same way.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which the present disclosure belongs. It will be further understood that terms used herein should be interpreted as having a meaning that is consistent with their meaning in the context of this specification and the relevant art and will not be interpreted in an idealized or overly formal sense unless expressly so defined herein.

Detailed description of functions and structures well known to those skilled in the art will be omitted to avoid obscuring the subject matter of the present disclosure. This aims to omit unnecessary description so as to make the subject matter of the present disclosure clear.

Various embodiments of the present disclosure will now be described more fully hereinafter with reference to the accompanying drawings, in which preferred embodiments of the present disclosure are shown, so that those of ordinary skill in the art can easily carry out the technical idea of the present disclosure.

FIG. 1 is a block diagram illustrating a memory system 1000 in accordance with an embodiment of the present disclosure.

Referring to FIG. 1, the memory system 1000 may include a memory device 1100, a controller 1200, and a host 1300. The memory device 1100 may include a plurality of semiconductor memories 100. The plurality of semiconductor memories 100 may be divided into a plurality of groups. Although in the present embodiment the host 1300 has been illustrated and described as being included in the memory system 1000, the memory system 1000 may include only the controller 1200 and the memory device 1100, and the host 1300 may be disposed outside the memory system 1000.

In FIG. 1, it is illustrated that the plurality of groups of the semiconductor memories 100 communicate with the controller 1200 through first to n-th channels CH1 to CHn, respectively. Each semiconductor memory 100 will be described below with reference to FIG. 4.

Each group may communicate with the controller 1200 through one common channel. The controller 1200 may control the plurality of semiconductor memories 100 of the memory device 1100 through the plurality of channels CH1 to CHn.

The controller 1200 is coupled between the host 1300 and the memory device 1100. The controller 1200 may access the memory device 1100 in response to a request from the host 1300. For example, the controller 1200 may control a read operation, a write operation, an erase operation, or a background operation of the memory device 1100 in response to a host command Host_CMD received from the host 1300. The host 1300 may transmit an address ADD and data DATA along with the host command Host_CMD during a write operation, and may transmit an address ADD along with the host command Host_CMD during a read operation. The controller 1200 may transmit data DATA read during the read operation to the host 1300. The controller 1200 may provide an interface between the memory device 1100 and the host 1300. The controller 1200 may run firmware for controlling the memory device 1100.

When a host command Host_CMD corresponding to a read command is received from the host 1300, the controller 1200 may control the memory device 1100 to perform a read operation, and may accumulate and manage a read count of each of a plurality of memory blocks included in the memory device 1100. The controller 1200 may control the memory device 1100 to perform a read reclaim operation of detecting and selecting a victim memory block having a read count greater than a preset reference count and storing, in a target memory block of the plurality of memory blocks, valid data stored in the victim memory block. The target memory block may be selected from among free blocks each having an erased status included in the memory device 1100. Furthermore, the controller 1200 may control, during the read reclaim operation, a program mode of storing valid data in a target memory block depending on the amount of valid data read from the memory device 1100. For example, in the case where during the read reclaim operation the amount of valid data read from the victim memory block is equal to or less than a preset reference amount, the valid data may be stored in the target memory block in a lower level cell program mode than a program mode of the victim memory block. For instance, if the victim memory block has been programmed in a triple level cell (TLC) program mode, the target memory block may store the valid data in a single level cell (SLC) program mode, or a multi-level cell (MLC) program mode. In the case where the amount of valid data read from the victim memory block is greater than the preset reference amount, the valid data may be stored in the target memory block in the program mode of the victim memory block. The preset reference amount may be adjusted depending on the number of free blocks of the plurality of memory blocks included in the memory device 1100. For example, as the number of free blocks is increased, the preset reference amount may be increased. As the number of free blocks is reduced, the preset reference amount may be reduced.

The host 1300 may include a portable electronic device such as a computer, a personal digital assistant (PDA), a portable multimedia player (PMP), an MP3 player, a camera, a camcorder, or a mobile phone. The host 1300 may use a host command Host_CMD to make a request for a write operation, a read operation, an erase operation, etc. of the memory system 1000. To perform a write operation of the memory device 1100, the host 1300 may transmit a host command Host_CMD corresponding to a write command, data DATA, and an address ADD to the controller 1200. To perform a read operation, the host 1400 may transmit a host command Host_CMD corresponding to a read command, and an address ADD to the controller 1200. Here, the address ADD may be a logical address of data.

The controller 1200 and the memory device 1100 may be integrated into a single semiconductor device. In an embodiment, the controller 1200 and the memory device 1100 may be integrated into a single semiconductor device to form a memory card. For example, the controller 1200 and the memory device 1100 may be integrated into a single semiconductor device and form a memory card such as a personal computer memory card international association (PCM-CIA), a compact flash card (CF), a smart media card (SM or SMC), a memory stick multimedia card (MMC, RS-MMC, or MMCmicro), a SD card (SD, miniSD, microSD, or SDHC), or a universal flash storage (UFS).

The controller 1200 and the memory device 1100 may be integrated into a single semiconductor device to form a solid state drive (SSD). The SSD may include a storage device configured to store data in a semiconductor memory.

In an embodiment, the memory system 1000 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an embodiment, the memory device 1100 or the memory system 1000 may be embedded in various types of packages. For example, the memory device 1100 or the memory system 1000 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), or Wafer-Level Processed Stack Package (WSP).

Figure 2:
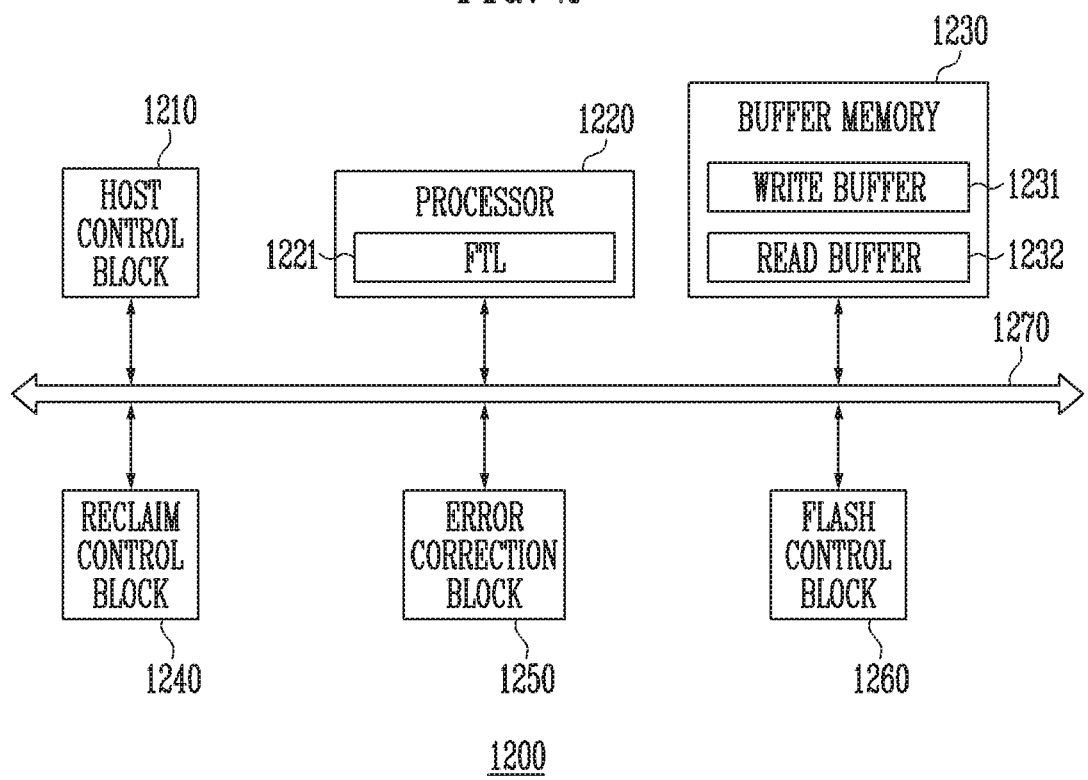
FIG. 2 is a block diagram illustrating the configuration of a controller of FIG. 1 in accordance with an embodiment of the present disclosure.

FIG. 2 is a diagram illustrating the controller 1200 of FIG. 1.

Referring to FIG. 2, the controller 1200 may include a host control block 1210, a processor 1220, a buffer memory 1230, a reclaim control block 1240, an error correction block 1250, a flash control block 1260, and a bus 1270.

The bus 1270 may provide a channel between the components of the controller 1200.

The host control block 1210 may control data transmission between the host 1300 of FIG. 1 and the buffer memory 1230. For example, the host control block 1210 may control an operation of buffering data input from the host 1300 in the buffer memory 1230. In an embodiment, the host control block 1210 may control an operation of outputting data buffered in the buffer memory 1230 to the host 1300.

The host control block 1210 may transmit, to the processor 1220, a host command and an address which are received from the host 1300.

The host control block 1210 may include a host interface.

The processor 1220 may control the overall operation of the controller 1200 and perform a logical operation. The processor 1220 may communicate with the host 1300 of FIG. 1 through the host control block 1210, and communicate with the memory device 1100 of FIG. 1 through the flash control block 1260. The processor 1220 may control the operation of the memory system 1000 by using the buffer memory 1230 as an operation memory or a cache memory. The processor 1220 may rearrange, based on priorities, a plurality of host commands received from the host 1300 and generate a command queue, and may control the flash control block 1260 based on the command queue.

The processor 1220 may include a flash translation layer (hereinafter, referred to as "FTL") 1221.

The FTL 1221 may drive firmware. The firmware may be stored in an additional memory (not illustrated) directly coupled to the buffer memory 1230 or the processor 1220, or may be stored in a storage space defined in the processor 1220. During a write operation, the FTL 1221 may map a physical address corresponding to an address (e.g., a logical address) input from the host 1300 of FIG. 1. Furthermore, during a read operation, the FTL 1221 may check a physical address mapped to a logical address input from the host 1300.

The FTL 1221 may generate a command queue for controlling the flash control block 1260 in response to a host command received from the host 1300.

The buffer memory 1230 may be used as an operation memory or a cache memory of the processor 1220. The buffer memory 1230 may store codes and commands to be executed by the processor 1220. The buffer memory 1230 may store data that is processed by the processor 1220.

The buffer memory 1230 may include a write buffer 1231 and a read buffer 1232. The write buffer 1231 may temporarily store write data received along with a write command from the host 1300, and then transmit the temporarily stored data to the memory device 1100. During a read operation, the read buffer 1232 may temporarily store data received from the memory device 1100, and then transmit the temporarily stored data to the host 1300. Furthermore, during a read reclaim operation, the read buffer 1232 may temporarily store valid data received from a victim memory block of the memory device 1100, and then transmit the temporarily stored valid data to a target memory block of the memory device 1100.

The buffer memory 1230 may include a static RAM (SRAM) or a dynamic RAM (DRAM).

The reclaim control block 1240 may manage a read count of each of the plurality of memory blocks included in the memory device 1100, detect and select a memory block having a read count greater than a preset reference count among the plurality of memory blocks, and control the buffer memory 1230 and the flash control block 1260 to perform a read reclaim operation on the victim memory block.

Furthermore, during the read reclaim operation, the reclaim control block 1240 may set a program mode of the target memory block depending on the amount of valid data read from the victim memory block. For example, in the case where during the read reclaim operation the amount of valid data read from the victim memory block is equal to or less than a preset reference amount, the reclaim control block 1240 may control the flash control block 1260 such that the valid data is programmed to the target memory block in a lower level cell program mode than a program mode of the victim memory block. For instance, if the victim memory block has been programmed in a TLC program mode, the target memory block may store the valid data in an SLC program mode or an MLC program mode thereby having an advantageous effect of increasing data reliability. In the case where the amount of valid data read from the victim memory block is greater than the preset reference amount, the reclaim control block 1240 may control the flash control block 1260 such that the valid data is stored in the target memory block in the program mode of the victim memory block.

For example, the reclaim control block 1240 may be included in the processor 1220 as a component of the processor 1220.

The error correction block 1250 may perform an error correction operation. The error correction block 1250 may perform an error correction code (ECC) encoding operation based on data to be written to the memory device 1100 of FIG. 1 through the flash control block 1260. ECC encoded data may be transmitted to the memory device 1100 through the flash control block 1260. The error correction block 1250 may perform an ECC decoding operation for data received from the memory device 1100 through the flash control block 1260. For example, the error correction block 1250 may be included in the flash control block 1260 as a component of the flash control block 1260.

The flash control block 1260 may generate and output an internal command for controlling the memory device 1100 in response to a command queue generated from the processor 1220. During a write operation, the flash control block 1260 may control an operation of transmitting and writing data buffered in the write buffer 1231 of the buffer memory 1230 to the memory device 1100. In an embodiment, during a read operation, the flash control block 1260 may control an operation of buffering, in the read buffer 1232 of the buffer memory 1230, data read from the memory device 1100 in response to a command queue. Furthermore, during a read reclaim operation, the flash control block 1260 may control the memory device 1100 to perform the read reclaim operation under control of the reclaim control block 1240. For example, during the read reclaim operation, the flash control block 1260 may control the memory device 1100 to read valid data from a victim memory block of the plurality of memory blocks included in the memory device 1100, and may receive the read valid data and store the received valid data in the read buffer 1232 of the buffer memory 1230. Furthermore, the flash control block 1260 may control the memory device 1100 such that the valid data stored in the read buffer 1232 is stored in a target memory block of the plurality of memory blocks included in the memory device 1100 in a program mode set by the reclaim control block 1240.

The flash control block 1260 may include a flash interface.

Figure 3:
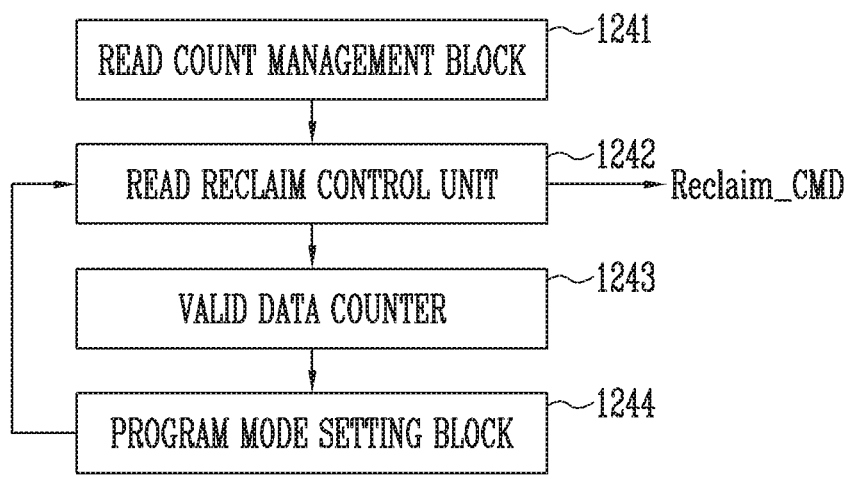
FIG. 3 is a block diagram illustrating the configuration of a reclaim control block of FIG. 2.

FIG. 3 is a block diagram illustrating the configuration of the reclaim control block 1240 of FIG. 2.

Referring to FIG. 3, the reclaim control block 1240 may include a read count management block 1241, a read reclaim control unit 1242, a valid data counter 1243, and a program mode setting block 1244.

The read count management block 1241 may accumulate and count a read count of each of the plurality of memory blocks included in the memory device 1100. The read count management block 1241 may manage the number of times read operations have been performed on each memory block after a program operation has been performed on the memory block, and increase, by 1, the read count of the memory block each time a read operation for the memory block has been completed, and accumulate the read count.

The read reclaim control unit 1242 may generate and output a reclaim command Reclaim_CMD for controlling a read reclaim operation on a memory block having a read count greater than the preset reference count among the plurality of memory blocks. For example, the read reclaim control unit 1242 may check a read count of each of the plurality of memory blocks that are managed by the read count management block 1241, detect a victim memory block having a read count greater than the preset reference count, generate a reclaim command Reclaim_CMD corresponding to the read reclaim operation on the detected victim memory block, and output the reclaim command Reclaim_CMD to the flash control block 1260 of FIG. 2.

Furthermore, during a read reclaim operation, the read reclaim control unit 1242 may receive information about a set program mode from the program mode setting block 1244, and control the flash control block 1260 to program valid data to a target memory block in the set program mode based on the information about the set program mode.

If the read reclaim control unit 1242 determines to perform a read reclaim operation, the valid data counter 1243 may count the amount of valid data read from the victim memory block.

The program mode setting block 1244 may set a program mode of the valid data by comparing the amount of valid data counted by the valid data counter 1243 with the preset reference amount. For example, in the case where during the read reclaim operation the amount of valid data read from the victim memory block is equal to or less than the preset reference amount, the program mode setting block 1244 may set a program mode of the target memory block to a lower level cell program mode than a program mode of the victim memory block. For example, if the victim memory block has been programmed in a TLC program mode, the program mode of the target memory block may be set to an SLC program mode or an MLC program mode.

In the case where the amount of valid data read from the victim memory block is greater than the preset reference amount, the program mode setting block 1244 may set the program mode of the target memory block to the program mode of the victim memory block.

Figure 4:
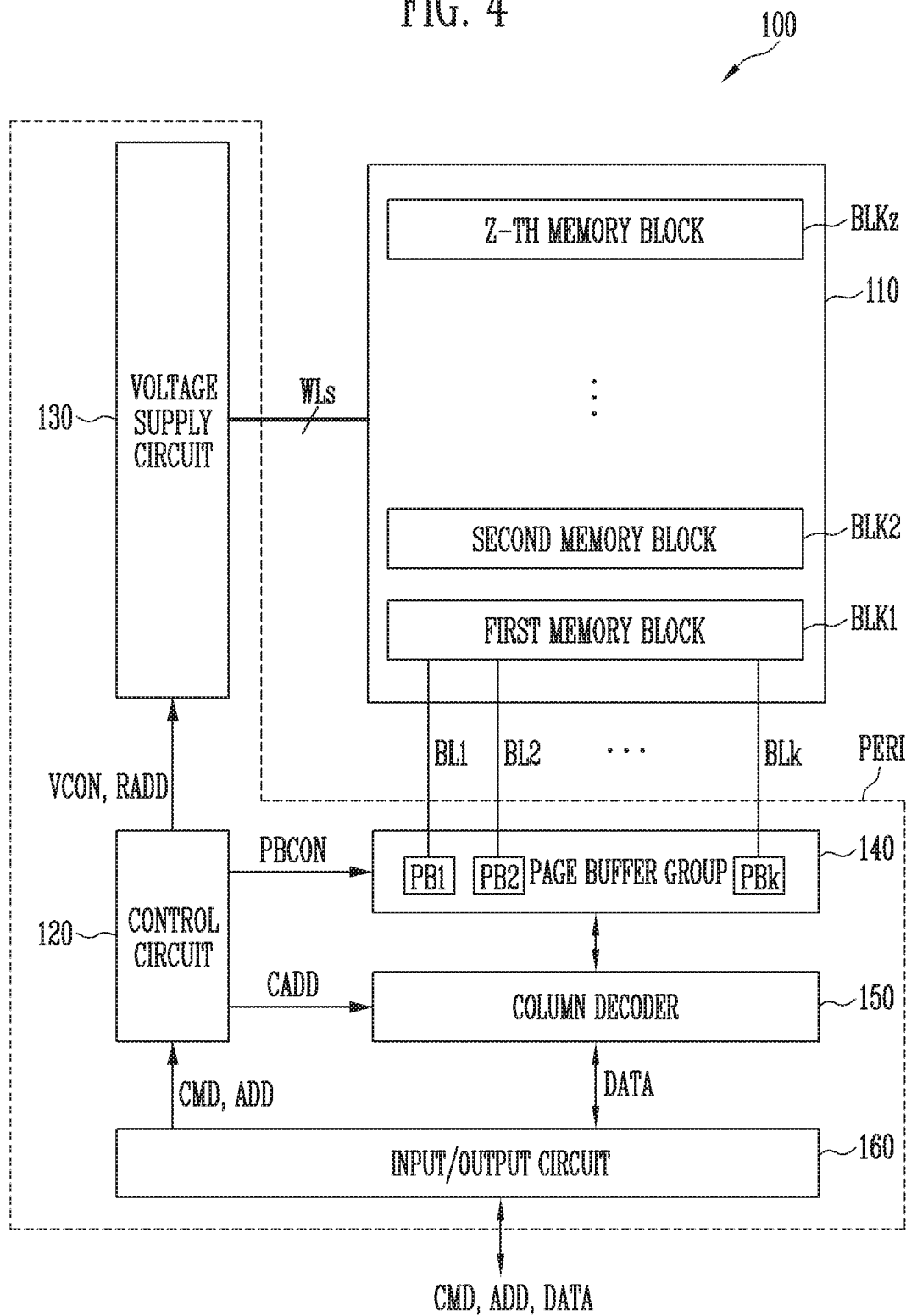
FIG. 4 is a diagram for describing a semiconductor memory of FIG. 1.

FIG. 4 is a block diagram for describing the semiconductor memory 100 of FIG. 1.

Referring to FIG. 4, the semiconductor memory 100 may include a memory cell array 110 including a plurality of memory blocks BLK1 to BLKz, and a peripheral circuit PERI configured to perform a program operation, a read operation, or an erase operation on memory cells included in a selected page of the plurality of memory blocks BLK1 to BLKz. The peripheral circuit PERI may include a control circuit 120, a voltage supply circuit 130, a page buffer group 140, a column decoder 150, and an input/output circuit 160.

The memory cell array 110 may include a plurality of memory blocks BLK1 to BLKz. Each of the memory blocks BLK1 to BLKz may include a plurality of pages. Each of the plurality of pages may include a plurality of memory cells. In an embodiment, the plurality of memory cells may be nonvolatile memory cells. This will be described in more detail with reference to FIGS. 5 and 6.

The control circuit 120 may output a voltage control signal VCON for generating a voltage needed to perform a read operation, a program operation, or an erase operation in response to an internal command CMD input from an external device through the input/output circuit 160, and output a PB control signal PBCON for controlling page buffers PB1 to PBk included in the page buffer group 140 depending on the type of operation. Furthermore, the control circuit 120 may output a row address signal RADD and a column address signal CADD in response to an address signal ADD input from the external device through the input/output circuit 160.

The voltage supply circuit 130 may supply operating voltages needed for a program operation, a read operation, and an erase operation of memory cells to local lines of the victim memory block including a drain select line, word lines WLs, and a source select line, in response to the voltage control signal VCON of the control circuit 120. The voltage supply circuit 130 may include a voltage generating circuit and a row decoder.

The voltage generating circuit may output the operating voltages needed for the program operation, the read operation, and the erase operation of the memory cells to global lines, in response to the voltage control signal VCON of the control circuit 120.

The row decoder may couple, in response to row address signals RADD of the control circuit 120, the global lines to the local lines such that the operating voltages output from the voltage generating circuit to the global lines may be transmitted to the local lines of the victim memory block in the memory cell array 110.

The page buffer group 140 may include a plurality of page buffers PB1 to PBk coupled with the memory cell array 110 through bit lines BL1 to BLk. In response to a PB control signal PBCON of the control circuit 120, the page buffers PB1 to PBk of the page buffer group 140 may selectively precharge the bit lines BL1 to BLk depending on input data to be stored to the memory cells, or may sense voltages of the bit lines BL1 to BLk to read data from the memory cells.

The column decoder 150 may select the page buffers PB1 to PBk included in the page buffer group 140 in response to a column address signal CADD output from the control circuit 120. The column decoder 150 may successively transmit data DATA to be stored to the memory cells, to the page buffers PB1 to PBk in response to the column address signal CADD. Furthermore, during a read operation, the column decoder 150 may successively select the page buffers PB1 to PBk in response to a column address signal CADD such that data DATA of memory cells latched to the page buffers PB1 to PBk may be output to the external device.

During a program operation, the input/output circuit 160 may transmit input data DATA to be stored to the memory cells, to the column decoder 150 under control of the control circuit 120 so that the data DATA may be input to the page buffer group 140. When the column decoder 150 transmits the data DATA transmitted from the input/output circuit 160 to the page buffers PB1 to PBk of the page buffer group 140, the page buffers PB1 to PBk may store the input data DATA in internal latch circuits thereof. During a read operation, the input/output circuit 160 may output, to the external device, data DATA transmitted from the page buffers PB1 to PBk of the page buffer group 140 through the column decoder 150.

Figure 5:
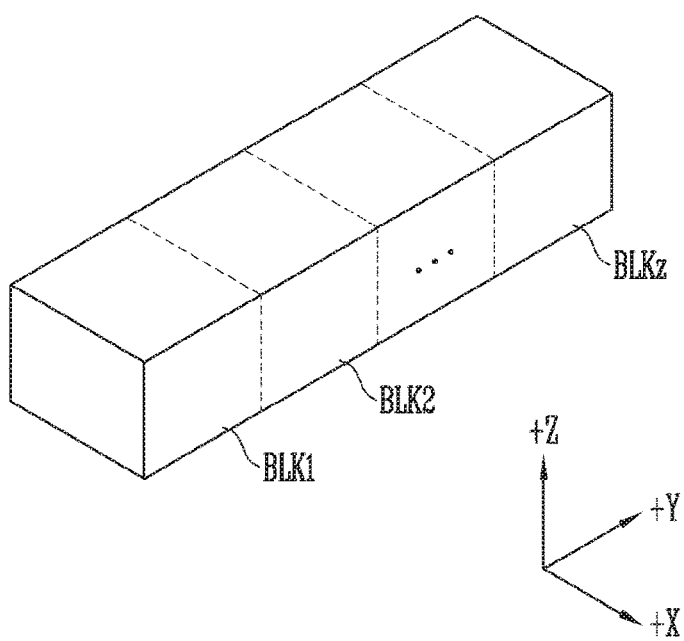
FIG. 5 is a block diagram illustrating a memory cell array of FIG. 4 in accordance with an embodiment of the present disclosure.

FIG. 5 is a block diagram illustrating the memory cell array 110 of FIG. 4 in accordance with an embodiment of the present disclosure.

Referring to FIG. 5, the memory cell array 110 may include a plurality of memory blocks BLK1 to BLKz. Each memory block has a three-dimensional structure. Each memory block may include a plurality of memory cells stacked on a substrate. The memory cells are arranged in a +X direction, a +Y direction, and a +Z direction. The structure of each memory block will be described in more detail with reference to FIG. 6.

Figure 6:
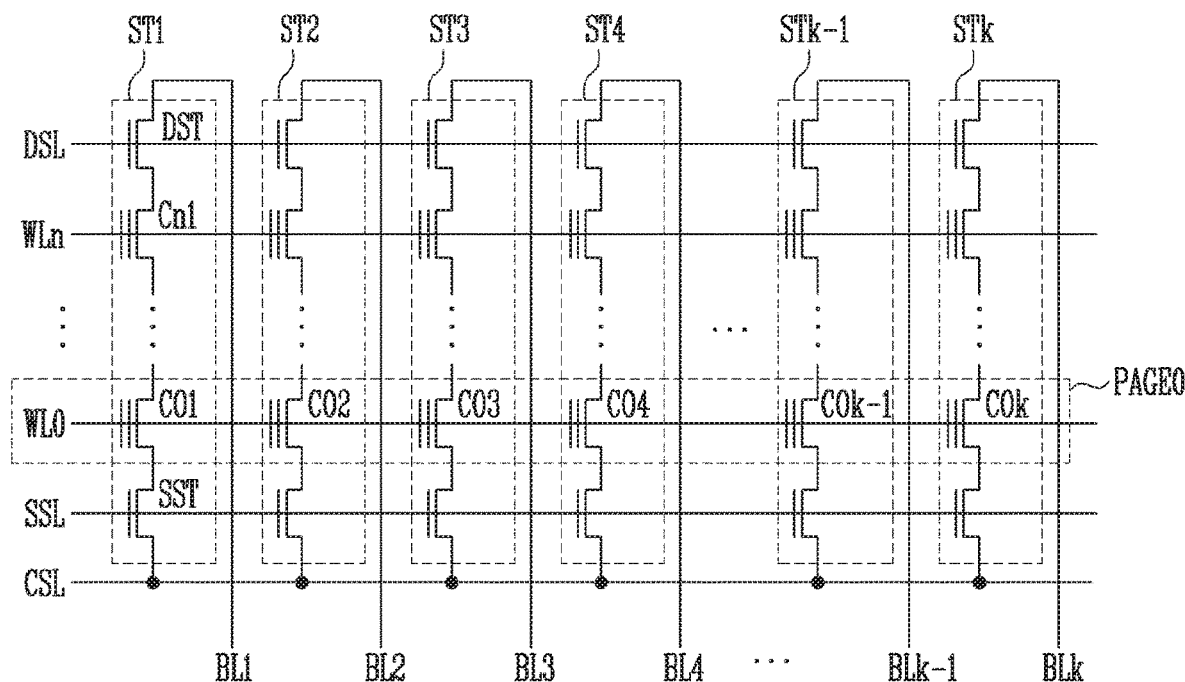
FIG. 6 is a circuit diagram for describing a memory block illustrated in FIG. 5.

FIG. 6 is a circuit diagram for describing the memory block illustrated in FIG. 5.

Referring to FIG. 6, each memory block may include a plurality of strings ST1 to STk coupled between the bit lines BL1 to BLk and a common source line CSL. The strings ST1 to STk may be respectively coupled with the corresponding bit lines BL1 to BLk and coupled in common with the common source line CSL. Each string, e.g., ST1, may include a source select transistor SST having a source coupled to the common source line CSL, a plurality of memory cells C01 to Cn1, and a drain select transistor DST having a drain coupled to the bit line BL1. The memory cells C01 to Cn1 may be coupled in series between the select transistors SST and DST. A gate of the source select transistor SST may be coupled to the source select line SSL. Gates of the memory cells C01 to Cn1 may be respectively coupled to the word lines WL0 to WLn. A gate of the drain select transistor DST may be coupled to the drain select line DSL.

The memory cells included in the memory block may be divided on a physical page basis or on a logical page basis. For example, memory cells C01 to C0$k$ coupled to a single word line (e.g., WL0) may form a single physical page PAGE0.

Figure 7:
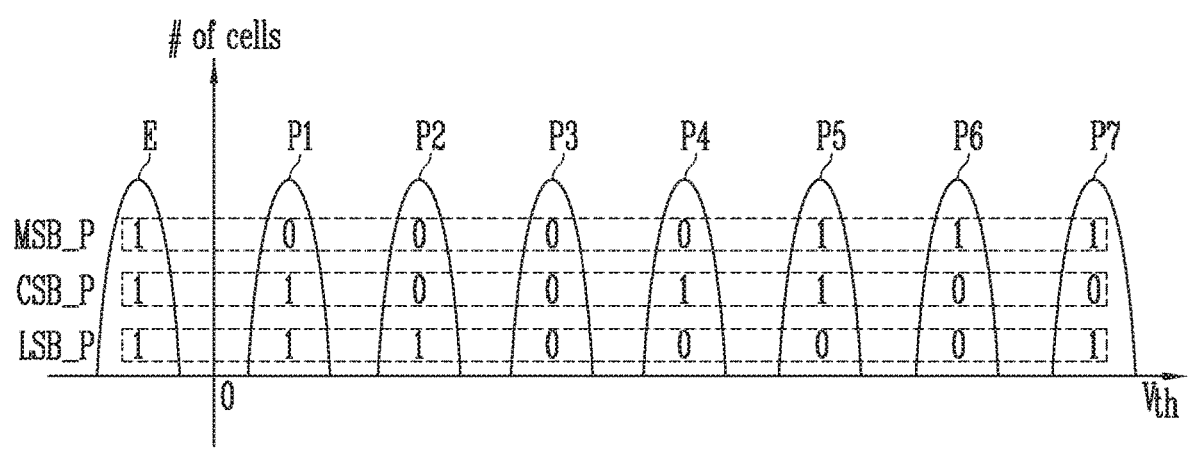
FIG. 7 is a threshold voltage distribution diagram for describing threshold voltage distributions of memory cells in accordance with an embodiment of the present disclosure.

FIG. 7 is a threshold voltage distribution diagram for describing threshold voltage distributions of memory cells in accordance with an embodiment of the present disclosure.

Each of the memory cells in accordance with an embodiment of the present disclosure may store a plurality of data bits. For example, a memory cell capable of storing 1-bit data is referred to as a single level cell (SLC), a memory cell capable of storing 2-bit data is referred to as a multi-level cell (MLC), a memory cell capable of storing 3-bit data is referred to as a triple level cell (TLC), and a memory cell capable of storing 4-bit data is referred to as a quadruple level cell (QLC). In following embodiments, the threshold voltage distributions of TLCs will be described by means of examples.

Referring to FIG. 7, a plurality of memory cells may be programmed to an erased status E and first to seventh programmed statuses P1 to P7, and each memory cell may store data including MSB data, CSB data, and LSB data.

Memory cells coupled to one word line may be defined as one physical page (e.g., PAGE 0) of FIG. 6. An MSB data group of the memory cells included in one physical page may be defined as an MSB page MSB_P, a CSB data group may be defined as a CSB page CSB_P, and an LSB data group may be defined as an LSB page LSB_P. That is, each physical page may include a plurality of logical pages (an MSB page MSB_P, a CSB page CSB_P and an LSB page LSB_P).

Figure 8:
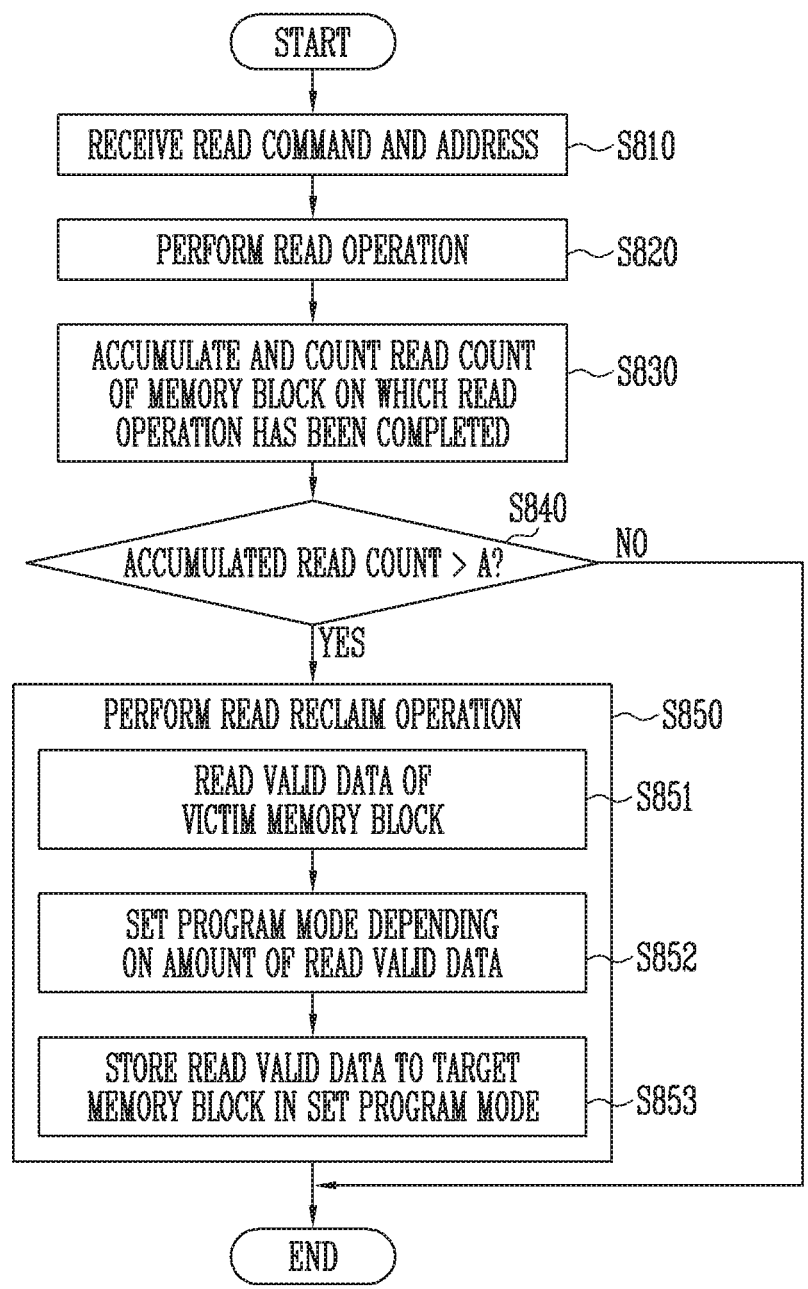
FIG. 8 is a flowchart illustrating the operation of the memory system in accordance with an embodiment of the present disclosure.

FIG. 8 is a flowchart illustrating the operation of the memory system in accordance with an embodiment of the present disclosure.

The method of operating the memory system in accordance with an embodiment of the present disclosure will be described with reference to FIGS. 1 to 8.

The controller 1200 receives, from the host 1300, an address and a host command Host_CMD corresponding to a read command (at step S810). The controller 1200 may receive a plurality of host commands Host_CMD from the host 1300. Hence, the controller 1200 may receive at least one or more read commands. In the case where a plurality of read commands are received, a plurality of addresses ADD corresponding to the respective read commands are also received.

The processor 1220 of the controller 1200 may generate a command queue corresponding to a read operation in response to the host command Host_CMD, and map a logical address of the received address ADD to a physical address. The flash control block 1260 may generate an internal command CMD for controlling the read operation of the memory device 1100 in response to a command queue generated by the processor 1220, and transmit the internal command CMD and the address ADD including the mapped physical address to the memory device 1100.

The memory device 1100 performs the read operation in response to the internal command CMD and the address ADD that are received from the controller 1200 (at step S820). For example, the memory device 1100 may perform a read operation on at least one or more selected physical pages PPG of a victim memory block (e.g., at least one memory block of the memory blocks BLK1 to BKz) of a selected semiconductor memory among the plurality of semiconductor memories 100 included in the memory device 1100, and transmit read data to the controller 1200.

The buffer memory 1230 of the controller 1200 may temporarily store the data received from the memory device 1100 in the read buffer 1232 before transmitting the data to the host 1300.

The read count management block 1241 of the reclaim control block 1240 accumulates and counts a read count of the memory block on which the read operation has been completed (at step S830).

The read reclaim control unit 1242 checks a read count of each of the plurality of memory blocks that are managed by the read count management block 1241, and detects a memory block having a read count greater than a preset reference count A (at step S840).

If a memory block having a read count greater than the preset reference count A is not present (NO), the operation of the memory system 1000 may end.

If at least one memory block having a read count greater than the preset reference count A is detected (YES), the controller 1200 performs a read reclaim operation on the detected memory block (at step S850).

The read reclaim operation will be described in more detail below.

The read reclaim control unit 1242 may select a victim memory block having a read count greater than the preset reference count A, and generate and output a reclaim command Reclaim_CMD for controlling the read reclaim operation for the victim memory block. The flash control block 1260 may control the memory device 1100 to perform an operation of reading valid data stored in the victim memory block in response to the reclaim command Reclaim_CMD.

The memory device 1100 reads the valid data of the victim memory block and transmits the read valid data to the controller 1200 under control of the flash control block 1260 (at step S851).

The valid data read from the victim memory block may be stored in the read buffer 1323 of the buffer memory 1230. The valid data counter 1243 may count the amount of valid data stored in the read buffer 1232.

The program mode setting block 1244 sets a program mode of the valid data by comparing the amount of valid data counted by the valid data counter 1243 with the preset reference amount (at step S852). For example, in the case where during the read reclaim operation the amount of valid data read from the victim memory block is equal to or less than the preset reference amount, the program mode setting block 1244 may set a program mode of the target memory block to a lower level cell program mode than a program mode of the victim memory block. For example, if the victim memory block has been programmed in a TLC program mode, the program mode of the target memory block may be set to an SLC program mode or an MLC program mode.

In the case where the amount of valid data read from the victim memory block is greater than the preset reference amount, the program mode setting block 1244 may set the program mode of the target memory block to the program mode of the victim memory block.

The read reclaim control unit 1242 may receive information about a set program mode from the program mode setting block 1244, and control the flash control block 1260 to program the valid data to a target memory block in the set program mode based on the information about the set program mode.

The flash control block 1260 may control the memory device 1100 to program, in the set program mode, the valid data stored in the read buffer 1232 to a target memory block of the plurality of memory blocks included in the memory device 1100. The memory device 1100 receives the valid data stored in the read buffer 1232 and programs the received valid data to the target memory block in the program mode set by the program mode setting block 1244 (at step S853).

In an embodiment, the target memory block may be a free block having an erased status among the plurality of memory blocks included in the memory device 1100.

Figure 9:
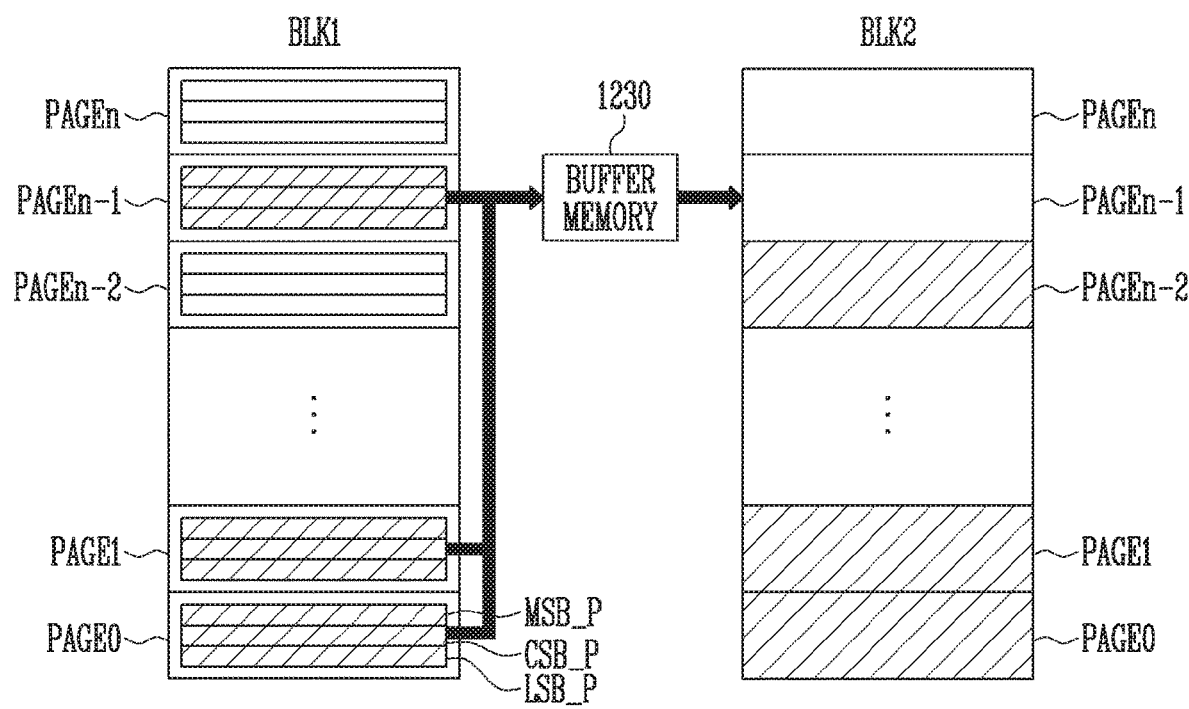
FIG. 9 is a diagram illustrating the flow of data during a read reclaim operation of the memory system in accordance with an embodiment of the present disclosure.

FIG. 9 is a diagram illustrating the flow of data during a read reclaim operation of the memory system in accordance with an embodiment of the present disclosure.

In this embodiment of the present disclosure, an example where a victim memory block (e.g., BLK1) is programmed in a TLC program mode will be described below.

Referring to FIG. 9, during a read reclaim operation, valid data stored in the victim memory block BLK1 having a read count greater than the preset reference count is read and transmitted to the buffer memory 1230. In this embodiment of the present disclosure, the valid data will be illustrated and described as being stored in some pages (e.g., PAGE0, PAGE1, and PAGEn-1) of the memory block BLK1.

The program mode setting block 1244 of FIG. 3 may set the program mode of a target memory block (e.g., BLK2) based on the amount of valid data stored in the buffer memory 1230. In this embodiment, there is illustrated and described the case where since the amount of valid data is equal to or less than the preset reference amount, the program mode of the target memory block is set to an SLC program mode.

The valid data stored in the buffer memory 1230 may be transmitted and programmed to the target memory block BLK2, in detail, to a plurality of pages (e.g., PAGE0 to PAGEn-2) of the target memory block BLK2 in the SLC program mode.

Although this embodiment of the present disclosure describes that during the read reclaim operation the valid data of the victim memory block that has been programmed in the TLC program mode is read and the read valid data is programmed to the target memory block in the SLC program mode, the read valid data may be programmed to the target memory block in the TLC program mode, the MLC program mode, or the SLC program mode depending on the amount of read valid data and the number of free blocks included in the memory device.

As described above, in various embodiments of the present disclosure, during a read reclaim operation, when valid data read from a victim memory block is programmed to a target memory block, the read valid data is programmed in a lower level cell program mode than the program mode of the victim memory block, whereby the reliability of the valid data may be improved. Furthermore, the program mode is selected depending on the amount of valid data, so that the number of free blocks may be prevented from being reduced to a predetermined value or less.

Figure 10:
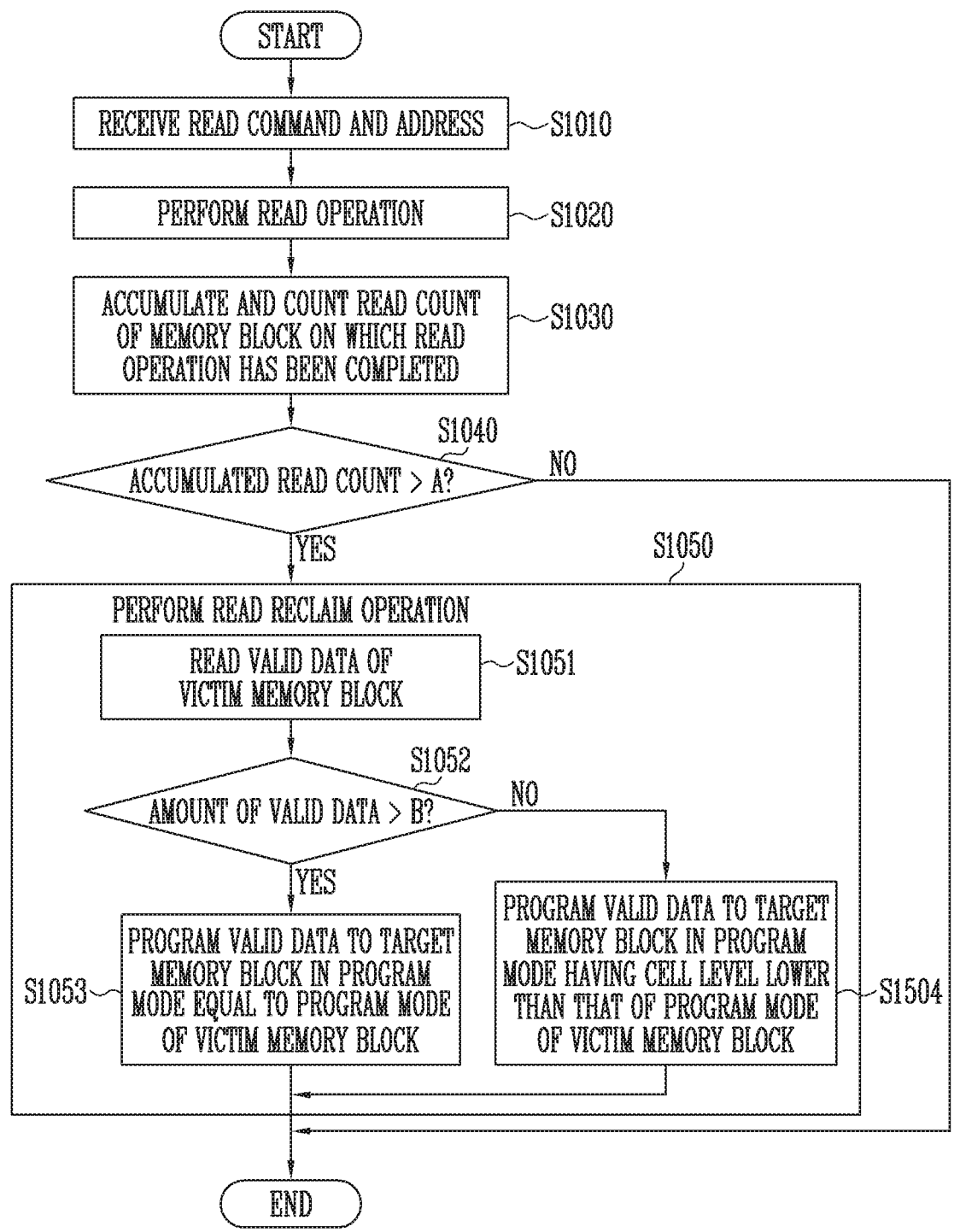
FIG. 10 is a flowchart for describing an operation of the memory system in accordance with an embodiment of the present disclosure.

FIG. 10 is a flowchart for describing an operation of the memory system in accordance with an embodiment of the present disclosure.

The method of operating the memory system in accordance with an embodiment of the present disclosure will be described with reference to FIGS. 1 to 7 and 10.

The controller 1200 receives, from the host 1300, an address and a host command Host_CMD corresponding to a read command (at step S1010). The controller 1200 may receive a plurality of host commands Host_CMD from the host 1300. Hence, the controller 1200 may receive at least one or more read commands. In the case where a plurality of read commands are received, a plurality of addresses ADD corresponding to the respective read commands are also received.

The processor 1220 of the controller 1200 may generate a command queue corresponding to a read operation in response to the host command Host_CMD, and map a logical address of the received address ADD to a physical address. The flash control block 1260 may generate an internal command CMD for controlling the read operation of the memory device 1100 in response to a command queue generated by the processor 1220, and transmit the internal command CMD and the address ADD including the mapped physical address to the memory device 1100.

The memory device 1100 performs the read operation in response to the internal command CMD and the address ADD that are received from the controller 1200 (at step S1020). For example, the memory device 1100 may perform a read operation on at least one or more selected physical pages PPG of a selected memory block (e.g., at least one memory block of the memory blocks BLK1 to BLKz) of a selected semiconductor memory among the plurality of semiconductor memories 100 included in the memory device 1100, and transmit read data to the controller 1200.

The buffer memory 1230 of the controller 1200 may temporarily store the data received from the memory device 1100 in the read buffer 1232 before transmitting the data to the host 1300.

The read count management block 1241 of the reclaim control block 1240 accumulates and counts a read count of the memory block on which the read operation has been completed (at step S1030).

The read reclaim control unit 1242 checks a read count of each of the plurality of memory blocks that are managed by the read count management block 1241, and detects a memory block having a read count greater than a preset reference count A (at step S1040).

If a memory block having a read count greater than the preset reference count A is not present (NO), the operation of the memory system 1000 may end.

If at least one memory block having a read count greater than the preset reference count A is detected (YES), the controller 1200 performs a read reclaim operation on the detected memory block (at step S1050).

The read reclaim operation will be described in more detail below.

The read reclaim control unit 1242 may select a victim memory block having a read count greater than the preset reference count A, and generate and output a reclaim command Reclaim_CMD for controlling the read reclaim operation for the victim memory block. The flash control block 1260 may control the memory device 1100 to perform an operation of reading valid data stored in the victim memory block in response to the reclaim command Reclaim_CMD.

The memory device 1100 reads the valid data of the victim memory block and transmits the read valid data to the controller 1200 under control of the flash control block 1260 (at step S1051).

The valid data read from the victim memory block is stored in the read buffer 1232 of the buffer memory 1230. The valid data counter 1243 counts the amount of valid data stored in the read buffer 1232, and the program mode setting block 1244 compares the amount of valid data counted by the valid data counter 1243 with a preset reference amount B (at step S1052).

If the result of the comparison step S1052 indicates that the amount of valid data read from the victim memory block is greater than the preset reference amount B (YES), the program mode setting block 1244 sets the program mode of the target memory block to the program mode of the victim memory block, and the read reclaim control unit 1242 controls the flash control block 1260 to program the valid data to the target memory block in the program mode set by the program mode setting block 1244. The flash control block 1260 may control the memory device 1100 to program, in the set program mode, the valid data stored in the read buffer 1232 to the target memory block of the plurality of memory blocks included in the memory device 1100. The memory device 1100 receives the valid data stored in the read buffer 1232 and programs the received valid data to the target memory block in the program mode set by the program mode setting block 1244 (at step S1053).

For example, in the case where the victim memory block has been programmed in the TLC program mode, the program mode of the target memory block may be set to the TLC program mode. In the case where the victim memory block has been programmed in the MLC program mode, the program mode of the target memory block may be set to the MLC program mode.

If the result of the comparison step S1052 indicates that the amount of valid data read from the victim memory block is equal to or less than the preset reference amount B (NO), the program mode setting block 1244 sets the program mode of the target memory block to a lower level cell program mode than the victim memory block, and the read reclaim control unit 1242 controls the flash control block 1260 to program the valid data to the target memory block in the program mode set by the program mode setting block 1244. The flash control block 1260 may control the memory device 1100 to program, in the set program mode, the valid data stored in the read buffer 1232 to the target memory block of the plurality of memory blocks included in the memory device 1100. The memory device 1100 receives the valid data stored in the read buffer 1232 and programs the received valid data to the target memory block in the program mode set by the program mode setting block 1244 (at step S1054).

For example, in the case where the victim memory block has been programmed in the TLC program mode, the program mode of the target memory block may be set to the MLC program mode or the SLC program mode. In the case where the victim memory block has been programmed in the MLC program mode, the program mode of the target memory block may be set to the SLC program mode.

Figure 11:
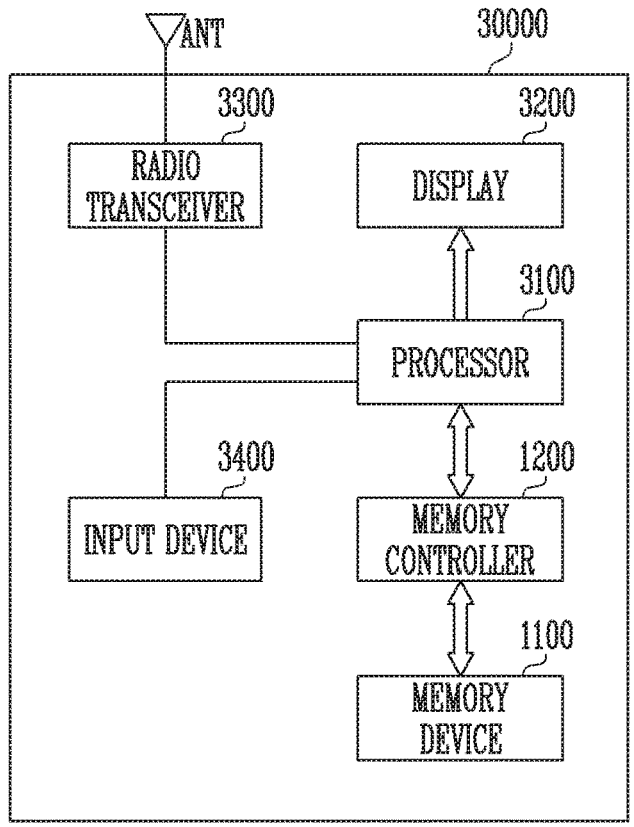
FIG. 11 is a diagram illustrating a memory system in accordance with an embodiment of the present disclosure.

FIG. 11 is a diagram illustrating a memory system 3000 in accordance with an embodiment of the present disclosure.

Referring to FIG. 11, the memory system 30000 may be embodied in a cellular phone, a smartphone, a tablet PC, a personal digital assistant (PDA) or a wireless communication device. The memory system 30000 may include a memory device 1100, and a memory controller 1200 configured to control the operation of the memory device 1100. The memory controller 1200 may control a data access operation, e.g., a program operation, an erase operation, or a read operation, of the memory device 1100 under control of a processor 3100.

Data programmed in the memory device 1100 may be outputted through a display 3200 under control of the memory controller 1200.

A radio transceiver 3300 may send and receive radio signals through an antenna ANT. For example, the radio transceiver 3300 may change a radio signal received through the antenna ANT into a signal capable of being processed in the processor 3100. Therefore, the processor 3100 may process a signal output from the radio transceiver 3300 and transmit the processed signal to the memory controller 1200 or the display 3200. The memory controller 1200 may program a signal processed by the processor 3100 to the memory device 1100. Furthermore, the radio transceiver 3300 may change a signal output from the processor 3100 into a radio signal, and output the changed radio signal to an external device through the antenna ANT. An input device 3400 may be used to input a control signal for controlling the operation of the processor 3100 or data to be processed by the processor 3100. The input device 3400 may be embodied in a pointing device such as a touch pad and a computer mouse, a keypad or a keyboard. The processor 3100 may control the operation of the display 3200 such that data output from the memory controller 1200, data output from the radio transceiver 3300, or data output form the input device 3400 is output through the display 3200.

In an embodiment, the memory controller 1200 capable of controlling the operation of the memory device 1100 may be embodied as a part of the processor 3100 or a chip provided separately from the processor 3100. The memory controller 1200 may be implemented using the example of the controller 1200 shown in FIG. 2.

Figure 12:
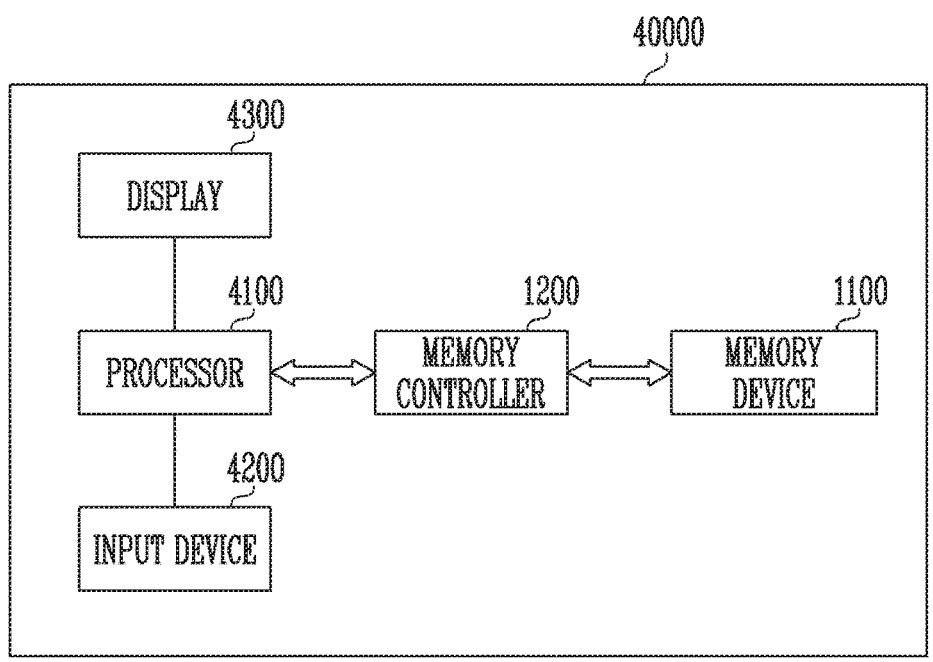
FIG. 12 is a diagram illustrating a memory system in accordance with an embodiment of the present disclosure.

FIG. 12 is a diagram illustrating a memory system 40000 in accordance with an embodiment of the present disclosure.

Referring to FIG. 12, the memory system 40000 may be embodied in a personal computer (PC), a tablet PC, a net-book, an e-reader, a personal digital assistant (PDA), a portable multimedia player (PMP), an MP3 player, or an MP4 player.

The memory system 40000 may include a memory device 1100, and a memory controller 1200 configured to control the data processing operation of the memory device 1100.

A processor 4100 may output data stored in the memory device 1100 through a display 4300, according to data inputted from an input device 4200. For example, the input device 4200 may be embodied in a pointing device such as a touch pad or a computer mouse, a keypad, or a keyboard.

The processor 4100 may control the overall operation of the memory system 40000 and control the operation of the memory controller 1200. In an embodiment, the memory controller 1200 capable of controlling the operation of the memory device 1100 may be embodied as a part of the processor 4100 or a chip provided separately from the processor 4100. The memory controller 1200 may be implemented using the example of the controller 1200 shown in FIG. 2.

Figure 13:
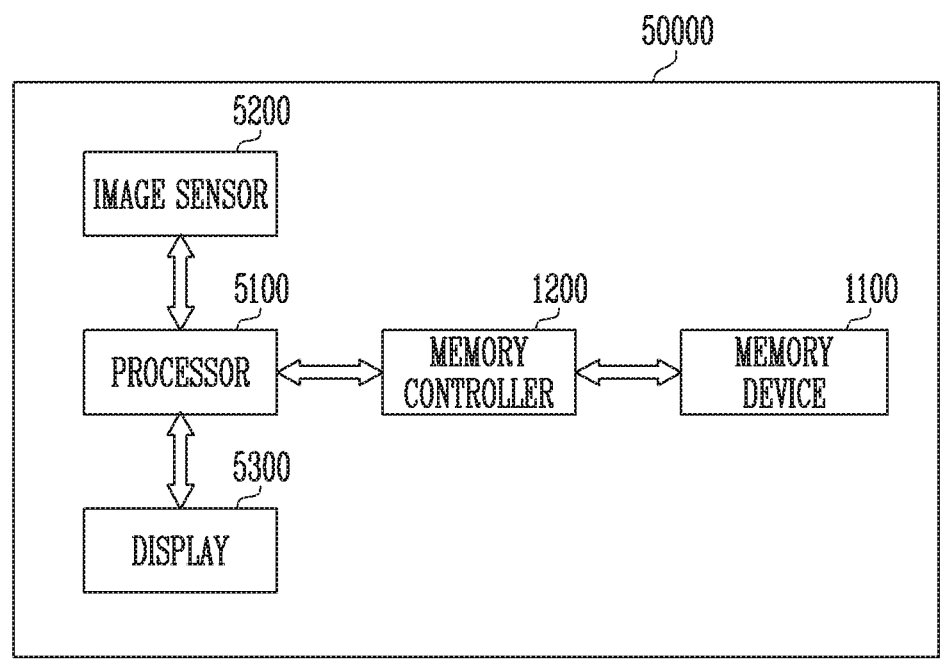
FIG. 13 is a diagram illustrating a memory system in accordance with an embodiment of the present disclosure.

FIG. 13 is a diagram illustrating a memory system 50000 in accordance with an embodiment of the present disclosure.

Referring to FIG. 13, the memory system 50000 may be embodied in an image processing device, e.g., a digital camera, a portable phone provided with a digital camera, a smartphone provided with a digital camera, or a tablet PC provided with a digital camera.

The memory system 50000 may include the memory device 1100, and a memory controller 1200 capable of controlling a data processing operation, e.g., a program operation, an erase operation, or a read operation, of the memory device 1100.

An image sensor 5200 of the memory system 50000 may convert an optical image into digital signals. The converted digital signals may be transmitted to a processor 5100 or the memory controller 1200. Under control of the processor 5100, the converted digital signals may be outputted through a display 5300 or stored in the memory device 1100 through the controller 1200. Data stored in the memory device 1100 may be outputted through the display 5300 under control of the processor 5100 or the memory controller 1200.

In an embodiment, the memory controller 1200 capable of controlling the operation of the memory device 1100 may be embodied as a part of the processor 5100 or a chip provided separately from the processor 5100. The memory controller 1200 may be implemented using the example of the controller 1200 shown in FIG. 2.

Figure 14:
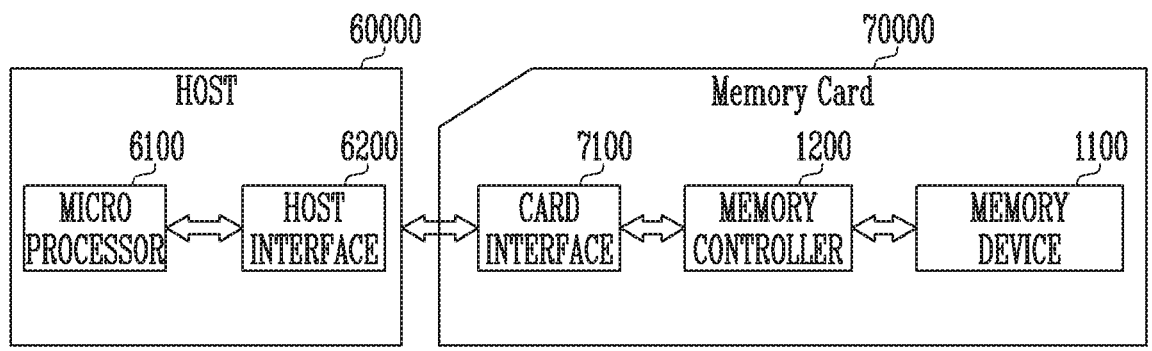
FIG. 14 is a diagram illustrating a memory system in accordance with an embodiment of the present disclosure.

FIG. 14 is a diagram illustrating a memory system 70000 in accordance with an embodiment of the present disclosure.

Referring to FIG. 14, the memory system 70000 may be embodied in a memory card or a smart card. The memory system 70000 may include a memory device 1100, a memory controller 1200, and a card interface 7100.

The controller 1200 may control data exchange between the memory device 1100 and the card interface 7100. In an embodiment, the card interface 7100 may be a secure digital (SD) card interface or a multi-media card (MMC) interface, but it is not limited thereto. The memory controller 1200 may be implemented using the example of the controller 1200 shown in FIG. 2.

The card interface 7100 may interface data exchange between a host 60000 and the memory controller 1200 according to a protocol of the host 60000. In an embodiment, the card interface 7100 may support a universal serial bus (USB) protocol, and an interchip (IC)-USB protocol. Here, the card interface may refer to hardware capable of supporting a protocol which is used by the host 60000, software installed in the hardware, or a signal transmission scheme.

When the memory system 70000 is connected to a host interface 6200 of the host 60000 such as a PC, a tablet PC, a digital camera, a digital audio player, a cellular phone, console video game hardware or a digital set-top box, the host interface 6200 may perform data communication with the memory device 1100 through the card interface 7100 and the memory controller 1200 under control of a microprocessor 6100.

As described above, in accordance with embodiments of the present disclosure, during a read reclaim operation, data read from a victim memory block is stored to a target memory block in a lower level cell program mode than a program mode of the victim memory block. Consequently, the reliability of the read reclaim operation may be improved.

Although the embodiments of the present disclosure have been disclosed, those skilled in the art will appreciate that various modifications, additions and substitutions are possible, without departing from the scope and spirit of the present disclosure.

Therefore, the scope of the present disclosure must be defined by the appended claims and equivalents of the claims rather than by the description preceding them.

In the above-discussed embodiments, all steps may be selectively performed or skipped. In addition, the steps in each embodiment may not be always performed in regular order. Furthermore, the embodiments disclosed in the present specification and the drawings aim to help those with ordinary knowledge in this art more clearly understand the present disclosure rather than aiming to limit the bounds of the present disclosure. One of ordinary skill in the art to which the present disclosure belongs will be able to easily understand that various modifications are possible based on the technical scope of the present disclosure.

Embodiments of the present disclosure have been described with reference to the accompanying drawings, and specific terms or words used in the description should be construed in accordance with the spirit of the present disclosure without limiting the subject matter thereof. It should be understood that many variations and modifications of the basic inventive concept described herein will still fall within the spirit and scope of the present disclosure as defined in the appended claims and their equivalents.

What is claimed is:

1. A memory system comprising:
   a memory device including a plurality of memory blocks; and
   a controller configured to control the memory device to perform a read operation in response to a host command, and configured to control a read reclaim operation based on a read count of each of the plurality of memory blocks,
   wherein, during the read reclaim operation, the controller selects a program mode of a target memory block according to an amount of valid data read from a victim memory block and a number of free blocks included in the memory device, and controls the memory device to store the valid data in the target memory block based on the selected program mode,
   wherein, if the amount of valid data is equal to or less than a preset reference amount and the number of free blocks each having an erased status is equal to or greater than a predetermined value, the controller selects a lower level cell program mode than a program mode of the victim memory block as the program mode of the target memory block,
   wherein, if the amount of valid data is greater than the preset reference amount and the number of free blocks each having the erased status is less than the predetermined value, the controller selects the program mode of the victim memory block as the program mode of the target memory block,
   wherein the program mode of the target memory block indicates an amount of data stored in a memory cell included in the plurality of memory blocks, and
   wherein the program mode of the target memory block is a single level cell program mode, a multi-level cell program mode or a triple level cell program mode.

2. The memory system according to claim 1, wherein the controller selects a memory block having a read count greater than a preset reference count among the plurality of memory blocks as the victim memory block, and selects any one of the free blocks among the plurality of memory blocks as the target memory block.

3. The memory system according to claim 1, wherein the controller comprises:
   a processor configured to generate a command queue in response to the host command;
   a reclaim controller configured to manage the read count of each of the plurality of memory blocks included in the memory device, and select the victim memory block among the plurality of memory blocks based on the read count of each of the plurality of memory blocks; and a flash control circuit configured to control the memory device to perform the read operation in response to the command queue provided from the processor and control the memory device to perform the read reclaim operation under control of the reclaim controller.

4. The memory system according to claim 3, wherein the reclaim controller comprises:
a read count manager configured to accumulate the read count of each of the plurality of memory blocks;
a read reclaim control circuit configured to receive read counts from the read count manager, select a memory block having a read count greater than a preset reference count as the victim memory block among the plurality of memory blocks based on the read counts, and output a reclaim command to instruct to perform the read reclaim operation on the victim memory block to the flash control circuit;
a valid data counter configured to count the amount of valid data read from the victim memory block during the read reclaim operation; and
a program mode setting circuit configured to compare the amount of valid data counted by the valid data counter with the preset reference amount and select the program mode of the target memory block.

5. The memory system according to claim 4, wherein the read reclaim control circuit controls, during the read reclaim operation, the flash control circuit to store the valid data to the target memory block in the program mode selected by the program mode setting circuit.

6. The memory system according to claim 4, wherein the preset reference amount is adjusted depending on the number of free blocks of the plurality of memory blocks.

7. A memory system comprising:
a memory device including a plurality of memory blocks; and
a controller configured to control a read reclaim operation of reading valid data stored in a victim memory block having a read count greater than a preset reference count among the plurality of memory blocks, and programming the valid data to a target memory block of the plurality of memory blocks,
wherein the controller selects a program mode of the target memory block based on an amount of valid data and a number of free blocks included in the memory device,
wherein, if the amount of valid data is equal to or less than a preset reference amount and the number of free blocks each having an erased status is equal to or greater than a predetermined value, the controller selects a lower level cell program mode than a program mode of the victim memory block as the program mode of the target memory block,
wherein, if the amount of valid data is greater than the preset reference amount and the number of free blocks each having the erased status is less than the predetermined value, the controller selects the program mode of the victim memory block as the program mode of the target memory block,
wherein the program mode of the target memory block indicates an amount of data stored in a memory cell included in the plurality of memory blocks, and
wherein the program mode of the target memory block is a single level cell program mode, a multi-level cell program mode or a triple level cell program mode.

8. The memory system according to claim 7, wherein the controller selects any one of the free blocks among the plurality of memory blocks as the target memory block.

9. The memory system according to claim 7, wherein the controller adjusts the preset reference amount based on the number of free blocks.

10. The memory system according to claim 7, wherein the controller comprises:
a host controller configured to output a host command provided from a host;
a processor configured to generate a command queue in response to the host command received from the host controller;
a reclaim controller configured to manage a read count of each of the plurality of memory blocks included in the memory device, and select the victim memory block among the plurality of memory blocks based on the read count of each of the plurality of memory blocks; and
a flash control circuit configured to control the memory device to perform a read operation in response to the command queue provided from the processor and control the memory device to perform the read reclaim operation under control of the reclaim controller.

11. The memory system according to claim 10, wherein the reclaim controller comprises:
a read count manager configured to accumulate and count the read count of each of the plurality of memory blocks;
a read reclaim control circuit configured to receive read counts from the read count manager, select a memory block having a read count greater than the preset reference count as the victim memory block among the plurality of memory blocks based on the read counts, and output a reclaim command to instruct to perform the read reclaim operation on the victim memory block to the flash control circuit;
a valid data counter configured to count the amount of valid data read from the victim memory block during the read reclaim operation; and
a program mode setting circuit configured to compare the amount of valid data counted by the valid data counter with the preset reference amount and select the program mode of the target memory block.

12. An operating method of a memory system, the operating method comprising:
performing a read operation on a memory device including a plurality of memory blocks;
selecting a memory block having a read count greater than a preset reference count among the plurality of memory blocks as a victim memory block;
reading valid data stored in the memory block selected as the victim memory block;
selecting a lower level cell program mode than a program mode of the victim memory block as a program mode of a target memory block based on an amount of valid data and a number of free blocks included in the memory device; and
programming the valid data into the target memory block based on the program mode of the target memory block selected as the lower level cell program mode than the program mode of the victim memory block,
wherein the amount of valid data is equal to or less than a preset reference amount,
wherein the number of free blocks each having an erased status is equal to or greater than a predetermined value,
wherein the program mode of the target memory block indicates an amount of data stored in a memory cell included in the plurality of memory blocks, and wherein the program mode of the target memory block is a single level cell program mode, a multi-level cell program mode or a triple level cell program mode.

13. The operating method of claim 12, wherein a threshold depends on a number of available blocks within the memory system.

* * * * *